(12) United States Patent
Gupta et al.

(10) Patent No.: US 12,095,520 B2
(45) Date of Patent: Sep. 17, 2024

(54) BIDIRECTIONAL BYPASS MODE

(71) Applicant: NXP USA, Inc., Austin, TX (US)

(72) Inventors: Ranjeet Kumar Gupta, Chandler, AZ (US); Siamak Delshadpour, Phoenix, AZ (US); Chandra Prakash Tiwari, Bangalore (IN); Abhijeet Chandrakant Kulkarni, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 162 days.

(21) Appl. No.: 17/538,586

(22) Filed: Nov. 30, 2021

(65) Prior Publication Data
US 2023/0170934 A1   Jun. 1, 2023

(51) Int. Cl.
*H04B 3/36*  (2006.01)
*G06F 13/42*  (2006.01)
*H03K 17/687*  (2006.01)

(52) U.S. Cl.
CPC ........... *H04B 3/36* (2013.01); *G06F 13/4282* (2013.01); *H03K 17/6872* (2013.01); *G06F 2213/0042* (2013.01)

(58) Field of Classification Search
CPC ...................................................... H04B 3/36

USPC ......................................................... 375/211
See application file for complete search history.

(56) References Cited

U.S. PATENT DOCUMENTS

| | | | |
|---|---|---|---|
| 6,680,874 B1 * | 1/2004 | Harrison | G11C 8/18 327/158 |
| 6,781,415 B2 | 8/2004 | Clark et al. | |
| 7,639,045 B2 | 12/2009 | Motamed et al. | |
| 7,928,766 B2 | 4/2011 | Welty | |
| 7,948,810 B1 | 5/2011 | Tang et al. | |
| 9,535,117 B2 | 1/2017 | Menon et al. | |
| 10,181,852 B1 | 1/2019 | Tiwari et al. | |
| 10,566,975 B1 | 2/2020 | Tiwari et al. | |
| 10,659,051 B1 | 5/2020 | Tiwari | |
| 2015/0363350 A1 * | 12/2015 | Yeung | G06F 13/4221 710/106 |
| 2022/0283624 A1 * | 9/2022 | Bajpai | G06F 1/3253 |

\* cited by examiner

*Primary Examiner* — Lihong Yu (57) ABSTRACT

Embodiments of bidirectional repeaters and communications systems are disclosed. In an embodiment, a bidirectional repeater includes a digital state machine configured to control the bidirectional repeater to operate under a functional mode or under a bypass mode and a bypass mode driver configured to automatically detect a direction of signal through input/output (I/O) terminals of the bidirectional repeater and to allow a signal to pass through the bidirectional repeater based on the direction of signal under the bypass mode.

19 Claims, 8 Drawing Sheets

BIDIRECTIONAL BYPASS MODE

BACKGROUND

A bidirectional repeater can be used to transport signals between different terminals or ports, for example, to extend the range of communications, to improve weak signals, and/or to translate between different signal characteristics. For example, an embedded Universal Serial Bus (USB) (eUSB)/USB repeater can be used to translate signals between one or more eUSB ports and one or more USB ports. In a bidirectional repeater, there is typically a bypass mode in which standard communications are bypassed, for example, for factory testing or other communication standards. For example, in an eUSB/USB repeater, there may be a bypass mode for factory testing or other communications standards (e.g., $I^2C$, universal asynchronous receiver-transmitter (UART), Joint Test Action Group (JTAG), Mobile Industry Processor Interface (MIPI), or MIPI Narrow Interface for Debug and Test (MIPI NIDnT) communications standards). However, implementing a bypass mode in a bidirectional repeater typically involves adding a complex circuitry, which occupies a large circuit substrate area, to the bidirectional repeater. Therefore, there is a need a technology for implementing a bypass mode in a bidirectional repeater that can be implemented in limited circuit substrate area.

SUMMARY

Embodiments of bidirectional repeaters and communications systems are disclosed. In an embodiment, a bidirectional repeater includes a digital state machine configured to control the bidirectional repeater to operate under a functional mode or under a bypass mode and a bypass mode driver configured to automatically detect a direction of signal through input/output (I/O) terminals of the bidirectional repeater and to allow a signal to pass through the bidirectional repeater based on the direction of signal under the bypass mode. Other embodiments are also described.

In an embodiment, the bypass mode driver is further configured to allow the signal to pass through the bidirectional repeater without alteration of a plurality of logic values carried by the signal under the bypass mode.

In an embodiment, the digital state machine is configured to control the bidirectional repeater to operate under the functional mode to translate a plurality of signals between the I/O terminals of the bidirectional repeater.

In an embodiment, the bypass mode driver is further configured to dynamically perform voltage level shifting of the signal under the bypass mode.

In an embodiment, the bidirectional repeater further includes multiplexers connected to the digital state machine and the bypass mode driver.

In an embodiment, the bidirectional repeater further includes transmitters connected to the I/O terminals of the bidirectional repeater and receivers connected to the I/O terminals of the bidirectional repeater, where the bypass mode driver is configured to allow the signal to transfer from one of the receivers to a corresponding transmitter of the transmitters based on the direction of signal.

In an embodiment, the bidirectional repeater further includes pull-up resistors connected to the receivers and the I/O terminals of the bidirectional repeater, pull-down resistors connected to the transmitters and the I/O terminals of the bidirectional repeater, and switches connected to the pull-up resistors or the pull-down resistors.

In an embodiment, the bypass mode driver is further configured to control the switches under the bypass mode.

In an embodiment, the bypass mode driver is further configured to control the switches and at least one of the transmitters under the bypass mode.

In an embodiment, the bypass mode driver is further configured to disable a P-channel metal-oxide-semiconductor field-effect transistor (MOSFET) (PMOS) transistor and an N-channel MOSFET (NMOS) transistor of at least one of the transmitters under the bypass mode.

In an embodiment, the digital state machine is further configured to generate a bypass mode enablement signal to enable the bidirectional repeater under the bypass mode.

In an embodiment, the bidirectional repeater is an embedded Universal Serial Bus (USB) (eUSB)/USB bidirectional repeater.

In an embodiment, the bidirectional repeater includes an eUSB port and a USB port.

In an embodiment, the bidirectional repeater and an eUSB device connected to the eUSB port are located on the same substrate.

In an embodiment, the bypass mode driver includes at least one pulse generator and buffers.

In an embodiment, a bidirectional repeater includes a digital state machine configured to control the bidirectional repeater to operate under a functional mode or under a bypass mode, transmitters connected to input/output (I/O) terminals of the bidirectional repeater, receivers connected to the I/O terminals of the bidirectional repeater, a bypass mode driver configured to automatically detect a direction of signal through the I/O terminals of the bidirectional repeater and to allow a signal to transfer from one of the receivers to a corresponding transmitter of the transmitters based on the direction of signal of logic values carried by the signal under the bypass mode, and multiplexers connected to the digital state machine and the bypass mode driver.

In an embodiment, the bidirectional repeater further includes pull-up resistors connected to the receivers and the I/O terminals of the bidirectional repeater, pull-down resistors connected to the transmitters and the I/O terminals of the bidirectional repeater, and switches connected to the pull-up resistors or the pull-down resistors.

In an embodiment, the bypass mode driver is further configured to control the switches and at least one of the transmitters under the bypass mode.

In an embodiment, the bidirectional repeater is an eUSB/USB bidirectional repeater.

In an embodiment, a communications system includes an eUSB/USB bidirectional repeater configured to operate under a functional mode or under a bypass mode, an USB controller connected to the eUSB bidirectional repeater, a multiplexer connected to the eUSB bidirectional repeater, and a system-on-chip (SoC) connected to the multiplexer, where the SoC includes a debug unit configured to perform a debug function and an eUSB physical layer unit.

Other aspects in accordance with the invention will become apparent from the following detailed description, taken in conjunction with the accompanying drawings, illustrated by way of example of the principles of the invention.

BRIEF DESCRIPTION OF THE DRAWINGS

Throughout the description, similar reference numbers may be used to identify similar elements.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

The present invention may be embodied in other specific forms without departing from its spirit or essential characteristics. The described embodiments are to be considered in all respects only as illustrative and not restrictive. The scope of the invention is, therefore, indicated by the appended claims rather than by this detailed description. All changes which come within the meaning and range of equivalency of the claims are to be embraced within their scope.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize, in light of the description herein, that the invention can be practiced without one or more of the specific features or advantages of a particular embodiment. In other instances, additional features and advantages may be recognized in certain embodiments that may not be present in all embodiments of the invention.

Reference throughout this specification to "one embodiment", "an embodiment", or similar language means that a particular feature, structure, or characteristic described in connection with the indicated embodiment is included in at least one embodiment of the present invention. Thus, the phrases "in one embodiment", "in an embodiment", and similar language throughout this specification may, but do not necessarily, all refer to the same embodiment.

Figure 1:
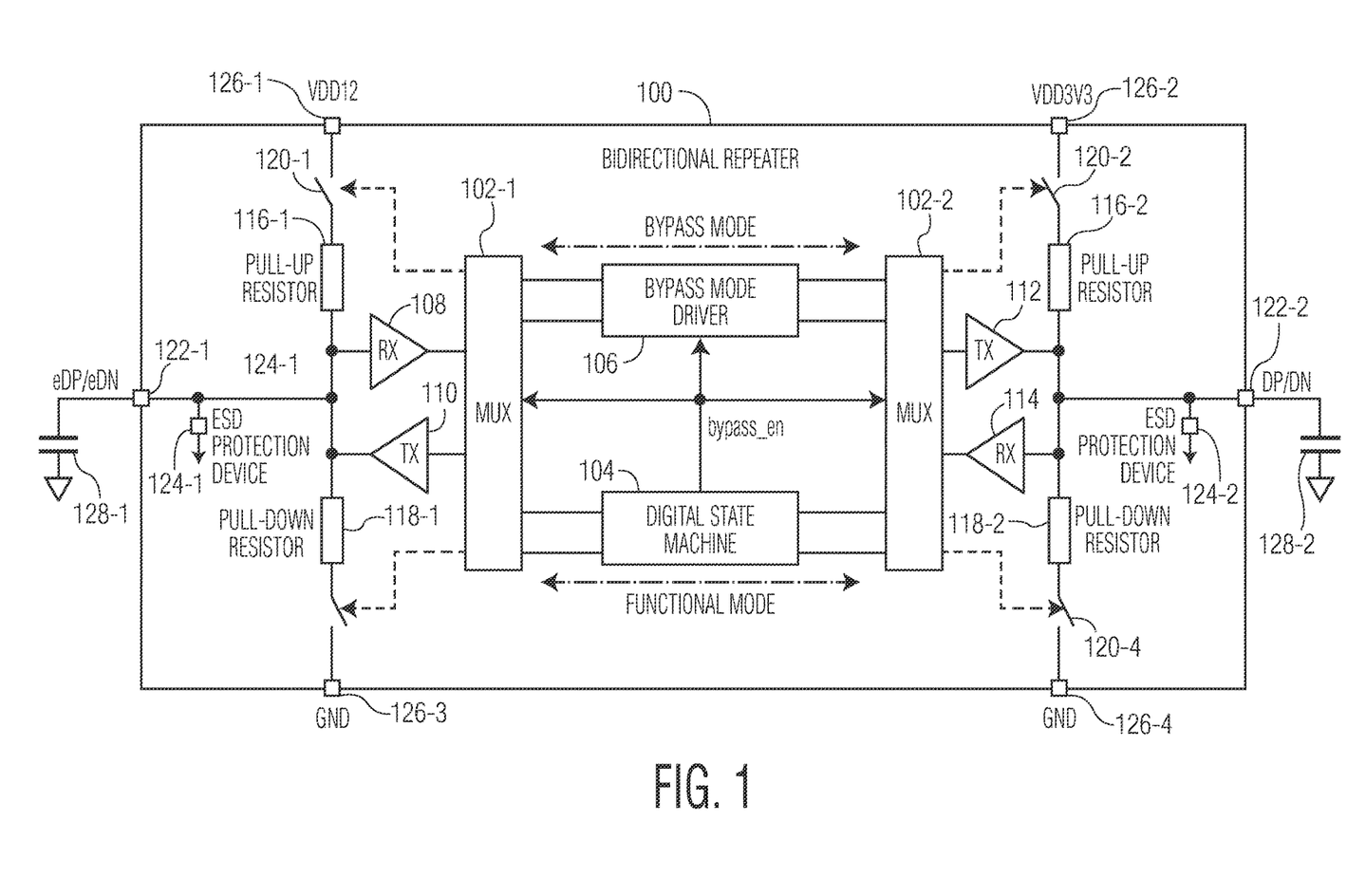
FIG. 1 is a schematic block diagram of a bidirectional repeater in accordance with an embodiment of the invention.

FIG. 1 is a schematic block diagram of a bidirectional repeater 100 in accordance with an embodiment of the invention. In the embodiment depicted in FIG. 1, the bidirectional repeater 100 includes two multiplexers (MUXs) 102-1, 102-2, a digital state machine 104, a bypass mode driver 106, a first receiver (RX) 108, a first transmitter (TX) 110, a second transmitter 112, a second receiver 114, two pull-up resistors 116-1, 116-2, two pull-down resistors 118-1, 118-2, four switches 120-1, 120-2, 120-3, 120-4, a first input/output (I/O) terminal or port 122-1, and a second I/O terminal or port 122-2. The bidirectional repeater 100 depicted in FIG. 1 can be used to transport signals between the I/O terminals 122-1, 122-2, for example, to translate signals between different signal characteristics, to extend the range of communications, and/or to improve weak signals. The bidirectional repeater 100 can be used in various applications, such as automotive applications, communications applications, industrial applications, medical applications, computer applications, and/or consumer or appliance applications. For example, the bidirectional repeater 100 can be used in USB, Thunderbolt (TBT), converged input/output (CIO), and/or DisplayPort (DP) applications. In some embodiments, the bidirectional repeater 100 is implemented in a substrate, such as a semiconductor wafer or a printed circuit board (PCB), and is packaged as a stand-alone semiconductor IC device or chip. In some embodiments, the bidirectional repeater 100 is included in a computing device, such as a smartphone, a tablet computer, a laptop, etc. Although the bidirectional repeater 100 is shown in FIG. 1 as including certain circuit elements, in other embodiments, the bidirectional repeater 100 may include one or more additional circuit elements. For example, the bidirectional repeater 100 may include one or more electrostatic discharge (ESD) protection circuits 124-1, 124-2 configured to protect the bidirectional repeater 100 in an ESD event such that an ESD discharge, which may be connected between a reference voltage (e.g., the ground) and the I/O terminals 122-1, 122-2, respectively. It should be mentioned that the shown ESD protection connection to ground is conceptual. It can be to ground, supply, ESD floating rail or any other proper node depending on the ESD strategy.

In some embodiments, the bidirectional repeater 100 is an eUSB/USB repeater that is used to translate signals between an eUSB port and a corresponding USB port. For example, the bidirectional repeater 100 is an eUSB2/USB2 repeater that operates as a bridge or a redriver between eUSB2 and legacy USB systems, or vice versa, to translate between legacy USB signaling voltage levels that are customarily about 3.3 volts (V) and eUSB2 signaling voltages levels that are circuit-level (e.g., silicon appropriate voltages) such as about 1.0V, 1.2V, 1.4V, or any other suitable value less than 3.3V. The embedded USB2 (eUSB2) specification is a supplement to the USB2.0 specification that addresses issues related to interface controller integration with advanced system-on-chip (SoC) process nodes by enabling USB2.0 interfaces to operate at I/O voltages of 1V or 1.2V instead of traditional 3.3V supply. eUSB2 can enable smaller, more power efficient SoCs, in turn enabling process nodes to continue to scale while increasing performance in applications such as smartphones, tablets and notebooks. As applications like smartphones and tablets continue to pack more and more components into smaller form factors, it is essential that interfaces shrink as well. However, the continued shrinking of SoC node size has led to a thinner gate oxide that can only support lower voltages. For devices relying on USB2.0 interfaces, this trend can lead to complicated design challenges for advanced process nodes. For example, when process nodes reach 7 nm, quantum effects begin impacting high-signaling-voltage inputs/outputs (IOs) such as 3.3V and can no longer be easily supported. Many device-to-device interfaces already support low signaling voltages, but USB2.0 still requires a 3.3V I/O voltage to operate. USB2.0 is widely used, and various SoCs are equipped with the USB2.0 interface. USB standards evolution kept the original 3.3V I/O USB 1.0 interface intact for backward compatibility, helping enable wider adoption and a larger ecosystem while also preserving device interoperability. As process nodes approach smaller features (e.g., 5 nm), the manufacturing cost to maintain USB2.0 3.3V I/O signaling has grown exponentially. eUSB2 addresses the I/O voltage gap as a physical layer supplement to the USB2.0 specification so that designers can integrate the eUSB2 interface at the device level while leveraging and reusing the USB2.0 interface at the system level. eUSB2 can support onboard inter-device connectivity through direct connections as well as exposed connector interfaces through an eUSB2-to-USB2.0/USB2-to-eUSB2 repeater, to perform level shifting. While USB2.0 can continue to be integrated into SoCs with process features of 7 nm and above, eUSB2 is a good fit for SoCs when process features are 5 nm and below. eUSB2 can also be integrated into other devices to easily interconnect with SoCs as a device-to-device interface. eUSB2 allows significant I/O power reduction and improves power efficiency, while enabling process features to continue to scale. When the bidirectional repeater 100 is an eUSB/USB repeater that is used to translate signals between an eUSB port and a corresponding USB port, bidirectional traffic may be carried by the repeater include low speed (LS), full speed (FS), and high speed (HS) traffic. An eUSB/USB repeater may have different voltage domains that serve the different ports. For example, a 1.8V source may be used to power the circuits related to the eUSB2 port, and a 3.3V source may be used to power the circuits related to the USB2 port. Each of the USB2 pins faces around 3.6V voltage in LS/FS mode and a signal that has a voltage lower than 1.1V in HS mode (0.44V in functional mode and lower than 1.1V in chirp mode, so it is assumed that the maximum signal in each of the USB2 pins during the HS-RX mode will be 1.1V). Alternatively, 1.2V or 1.0V supply can be used to support operations on an eUSB port.

In the embodiment depicted in FIG. 1, the bidirectional repeater 100 implements a bypass mode in which standard communications are bypassed, for example, for factory testing or other communication standards, and a functional mode in which standard communications are allowed. The bidirectional repeater 100 can detect the orientation of the incoming signal that needs to be passed and enable the right signal path. For example, under the functional mode, the bidirectional repeater 100 translate signals between the I/O terminals 122-1, 122-2, while under the bypass mode, the bidirectional repeater 100 allows signals to pass through without alteration of logic values (e.g., logic values carried by the signals are unchanged). In some embodiments, the bidirectional repeater 100 is an eUSB/USB repeater that implements a bypass mode for factory testing or other communications standards (e.g., I2C, UART, JTAG, MIPI, or MIPI NIDnT communications standards) and a functional mode in which standard communications are allowed. For example, under the functional mode, the bidirectional repeater 100 operates as a bridge or a redriver between eUSB2 and legacy USB systems, or vice versa, to translate between legacy USB signaling voltage levels that are customarily about 3.3 volts (V) and eUSB2 signaling voltages levels that are circuit-level (e.g., silicon appropriate voltages) such as about 1.0V, 1.2V, 1.4V, or any other suitable value less than 3.3 V, while under the bypass mode, the bidirectional repeater 100 allows signals to pass through without alteration (e.g., logic values carried by the signals are unchanged). In the embodiment depicted in FIG. 1, the bidirectional repeater 100 implements the bypass mode without adding a complex circuitry, which occupies a large circuit substrate area, to the bidirectional repeater. Compared to adding a complex circuitry having a large circuit substrate area, the bidirectional repeater 100 reuses existing components (e.g., the receivers (RXs) 108, 114 and/or the transmitters (TXs) 110, 112) to implement a bypass mode to shape an auto-direction sensing bidirectional scheme, which supports, for example, UART and JTAG signaling. Using the existing RX/TX combination to implement the bypass mode offers reduced complexity and consumes smaller circuit area, compared to traditional methods in which reference circuits are typically used. Consequently, the bidirectional repeater 100 can implement a bypass mode in limited circuit substrate area with reduced component and manufacturing costs.

In the embodiment depicted in FIG. 1, the multiplexers 102-1, 102-2 are connected between the receivers 108, 114, and the transmitters 110, 112 and the digital state machine 104 and the bypass mode driver 106 and configured to allow signals to move through the digital state machine 104 or the bypass mode driver 106 under a functional mode or under a bypass mode. The multiplexers may be implemented as hardware, firmware, and/or a combination of hardware, and/or firmware.

In the embodiment depicted in FIG. 1, the digital state machine 104 is configured to control the bidirectional repeater 100 to operate under a functional mode or under a bypass mode. In some embodiments, the digital state machine 104 is configured to control the bidirectional repeater 100 to operate under a functional mode in which standard communications are allowed or under a bypass mode in which standard communications are bypassed, for example, for factory testing or other communication standards. For example, under the functional mode, the digital state machine 104 is configured to translate signals between the I/O terminals 122-1, 122-2, while under the bypass mode, the digital state machine 104 is configured to generate a bypass mode enablement signal, bypass_en, to instruct the bypass mode driver 106 and/or the multiplexers 102-1, 102-2 to allow signals to pass through without alteration (e.g., logic values carried by the signals are unchanged). The digital state machine 104 may be implemented as hardware, software, firmware, and/or a combination of hardware, software, and/or firmware. In some embodiments, the digital state machine 104 is implemented as a processor such as a microcontroller or a central processing unit (CPU).

In the embodiment depicted in FIG. 1, the bypass mode driver 106 is configured to automatically detect a direction of signal through the I/O terminals 122-1, 122-2 of the bidirectional repeater and to allow a signal to pass through the bidirectional repeater based on the direction of signal under the bypass mode. For example, the bypass mode driver 106 is configured to allow signals to pass through (e.g., the I/O terminals 122-1, 122-2) the bidirectional repeater 100 without alteration (e.g., logic values carried by the signals are unchanged) under a bypass mode. The digital state machine 104 does not need to know the direction of signal. The signal can switch direction very fast and at random timings. The bypass mode driver 106 can automatically sense the driving side and receiving side and quickly adapt to the signal direction, and ensure signal and data is transferred from a transmitter to a corresponding receiver. In some embodiments, the bypass mode driver is configured to allow the signal to transfer from one of the receivers 108, 114 to a corresponding transmitter 110 or 112 based on the direction of signal. The autosensing of signal direction happens with voltage level conversion. For example, both sides signaling protocols can be at the same voltage level or at different levels. The bypass mode driver 106 can perform level shifting dynamically. In some embodiments, the bypass mode driver is further configured to dynamically perform voltage level shifting of the signal under the bypass mode. In some embodiments, the bypass mode driver 106 is configured to receive a bypass mode enablement signal, bypass_en, from the digital state machine 104 and to activate the bypass mode for the bidirectional repeater 100. In some embodiments, the bypass mode driver 106 is configured to generate signals to control at least one of the receivers 108, 114, the transmitters 110, 112, the pull-up resistors 116-1, 116-2, and the pull-down resistors 118-1, 118-2 to form a bypass data path for signals to pass through the bidirectional repeater 100 without alteration of logic values carried by the signals. The bypass mode driver 106 may be implemented as hardware, software, firmware, and/or a combination of hardware, software, and/or firmware. In some embodiments, the bypass mode driver 106 is implemented as a digital logic circuit having one or more logic gates. In some embodiments, the bypass mode driver 106 is configured to detect the orientation of the incoming signal that needs to be passed and enable a bypass data path for signals to pass through the bidirectional repeater 100 without alteration logic values carried by the signals. In some embodiments, the digital logic circuit includes at least an XOR gate and an AND gate.

In the embodiment depicted in FIG. 1, the two pull-up resistors 116-1, 116-2 and the two pull-down resistors 118-1, 118-2 are connected to the switches 120-1, 120-2, 120-3, 120-4, respectively. In some embodiments, the pull-up resistors 116-1, 116-2 have a resistance value of 10 kiloohm (kΩ), while the pull-down resistors 118-1, 118-2 have resistance values of 7 kΩ and 15 kΩ, respectively. The switch 120-1 is connected to a positive voltage, VDD12, which may be at 1.2 volt, through a voltage terminal or pin 126-1. The switch 120-2 is connected to a positive voltage, VDD3V3, which may be at 3.3 volt, through a voltage terminal or pin 126-2. The switches 120-3, 120-4 are connected to a reference voltage, for example, the ground (zero volt), through voltage terminals or pins 126-3, 126-4.

In the embodiment depicted in FIG. 1, the I/O terminals 122-1, 122-2 are configured to receive and transmit signals, which may be differential signals. In some embodiments, the I/O terminal 122-1 and the I/O terminal 122-2 are connected to devices of different types. In an embodiment, the I/O terminal 122-1 is connected to an eUSB device and the I/O terminal 122-2 is connected to an USB device, for example, a legacy USB2 device. In some embodiments, the I/O terminal 122-1 receives and transmits a differential eUSB signal (eD+ or eDP/eD− or eDN) while the I/O terminal 122-2 receives and transmits a differential USB signal (D+ or DP/D− or DN). In some embodiments, the bidirectional repeater 100 and an eUSB device that is connected to the I/O terminal 122-1 or 122-2 is located on the same substrate, for example, the same IC chip, while an USB device that is connected to the I/O terminal 122-1 or 122-2 is connected to the bidirectional repeater 100 via cabling. In some embodiments, capacitors 128-1, 128-2, for example, decoupling capacitors, are connected to the I/O terminals 122-1, 122-2, respectively, and a reference voltage (e.g., the ground).

Figure 2:
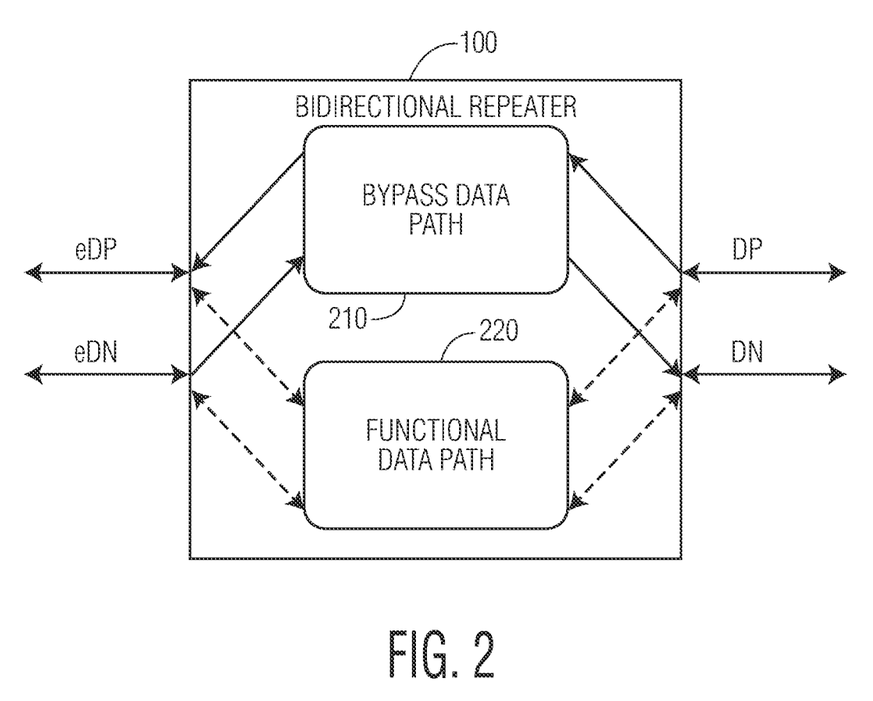
FIG. 2 shows a bypass data path under a bypass mode and a functional data path under a functional mode of the bidirectional repeater depicted in FIG. 1.

In some embodiments, the bidirectional repeater 100 is an eUSB repeater situated between an SoC and a USB connector, playing a critical role in allowing debug access to the SoC from the external world. While an eUSB repeater has to abide by the stringent requirements of the USB2.0 specification's LS (Low Speed), FS (Full Speed) and HS (High Speed) specifications, it also supports a bypass mode for facilitating system debug. While the USB2.0 LS, FS, HS signals are differential in nature with their own various amplitude settings, debug signals that need to be passed through could be of totally different nature. For example, debug signals may be open-drain (e.g., $I^2C$) or push-pull (e.g., JTAG, UART, SWD, MIPI), and may be unidirectional clocks or bi-directional data. FIG. 2 shows a bypass data path 210 under a bypass mode and a functional data path 220 under a functional mode of the bidirectional repeater 100 depicted in FIG. 1. In the embodiment depicted in FIG. 2, a differential eUSB signal (eDP/eDN) and a differential USB signal (DP/DN) flow through the bypass data path 210 under a bypass mode of the bidirectional repeater 100, while the differential eUSB signal (eDP/eDN) and the differential USB signal (DP/DN) flow through the functional data path 220 under a functional mode of the bidirectional repeater 100, which is also referred to as an eUSB to USB repeater mode. For example, under the functional mode, the bidirectional repeater 100 operates as a bridge or a redriver between eUSB2 and legacy USB systems, or vice versa, to translate between legacy USB signaling voltage levels that are customarily about 3.3 volts (V) and eUSB2 signaling voltages levels that are circuit-level (e.g., silicon appropriate voltages) such as about 1.0V, 1.2V, 1.4V, or any other suitable value less than 3.3 V, while under the bypass mode, the bidirectional repeater 100 allows signals to pass through without alteration of logic values carried by the signals. The bypass data path 210 can be used for signal transmission in system debugging, such as $I^2C$, UART, JTAG, Serial Wire Debug (SWD), MIPI, Serial Peripheral Interface (SPI). For example, a complex system with single or multiple processors and other peripheral ICs often has very limited means for debugging. Providing a dedicated pin or port on a system for debugging purpose is often too expensive because of the less-frequent need or usage of the dedicated pin. In the bidirectional repeater 100 depicted in FIG. 1, existing components are used to form the bypass data path that can be used for system debugging. Consequently, the bidirectional repeater 100 can implement a bypass mode without increasing the pin count.

In some embodiments, a bypass mode provides general purpose bi-directional buffer path between eDP and DP and between eDN and DN pins and does not involve any USB2 or eUSB2 protocol/signal handling. The bypass mode can be used for data communication via UART, JTAG, MIPI NIDnT, etc. The bypass mode can be enabled through, for example, an $I^2C$ register or one of the GPIO inputs. The signaling levels on eDP/eDN pins remain same as eUSB2 and for DP/DN pins, the signaling levels remain same as that of USB FS/LS. The signaling rate can be, for example, 20 Mbps. While under the bypass mode, when no signal drives the bus, a 15 kΩ pull down resistance is applied to hold the bus Low on USB2 ports on 7 KΩ pull down on the eUSB ports. In some embodiments, a bypass mode can be used only with push-pull signaling and not open drain signaling. The USB2 DP/DN pin has internal 2 MΩ pulldown resistors enabled under all situations except under the bypass mode.

Under the bypass mode, the pins may have 15 kΩ pulldown resistors and the bypass mode propagation delay may be around 25 ns. Table-1 provides some examples of electrical signaling characteristics under a bypass mode.

| Symbol | Parameter | Condition | Minimum | Maximum | Unit |
|---|---|---|---|---|---|
| $f_{BYPASS}$ | Bypass buffer path signaling rate | | 0 | 20 | Mbps |
| $V_{OL\_BYPASS\_eDX}$ | Bypass mode Low-level output voltage on eDP/eDN pins | (0.15 × internally derived 1.2 V reference from VDD1V8) | | 0.18 | V |
| $V_{OH\_BYPASS\_eDX}$ | Bypass mode high-level output voltage on eDP/eDN pins | (0.85 × internally derived 1.2 V reference from VDD1V8) | 1.02 | | V |
| $V_{IL\_BYPASS\_eDX}$ | Bypass mode Low-level input voltage on eDP/eDN pins | (0.35 × internally derived 1.2 V reference from VDD1V8) | −0.1 | 0.42 | V |
| $V_{IH\_BYPASS\_eDX}$ | Bypass mode high-level input voltage on eDP/eDN pins | (0.65 × internally derived 1.2 V reference from VDD1V8) | 0.78 | | V |
| $C_{\_PIN\_eDx}$ | Maximum load capacitance as seen on eDP or eDN pin | | | 10 | pF |
| $V_{OL\_BYPASS\_DX}$ | Bypass mode Low-level output voltage on DP/DN pins | | | 0.3 | V |
| $V_{OH\_BYPASS\_DX}$ | Bypass mode high-level output voltage on DP/DN pins | | 2 | | V |
| $V_{IL\_BYPASS\_DX}$ | Bypass mode Low-level input voltage on DP/DN pins | | | 0.8 | V |
| $V_{IH\_BYPASS\_DX}$ | Bypass mode high-level input voltage on DP/DN pins | | 2.8 | 3.6 | V |
| $t_{TURN\_BYPASS}$ | Bypass buffer turnaround time | Applicable for half duplex operation | 15 | 40 | ns |
| $t_{DET\_BYPASS}$ | Bypass path signal detection time | Applicable for half duplex operation | | 10 | ns |
| $t_{EN\_BYPASS}$ | Bypass path enable time | Applicable for half duplex operation | | 30 | ns |

Figure 3:
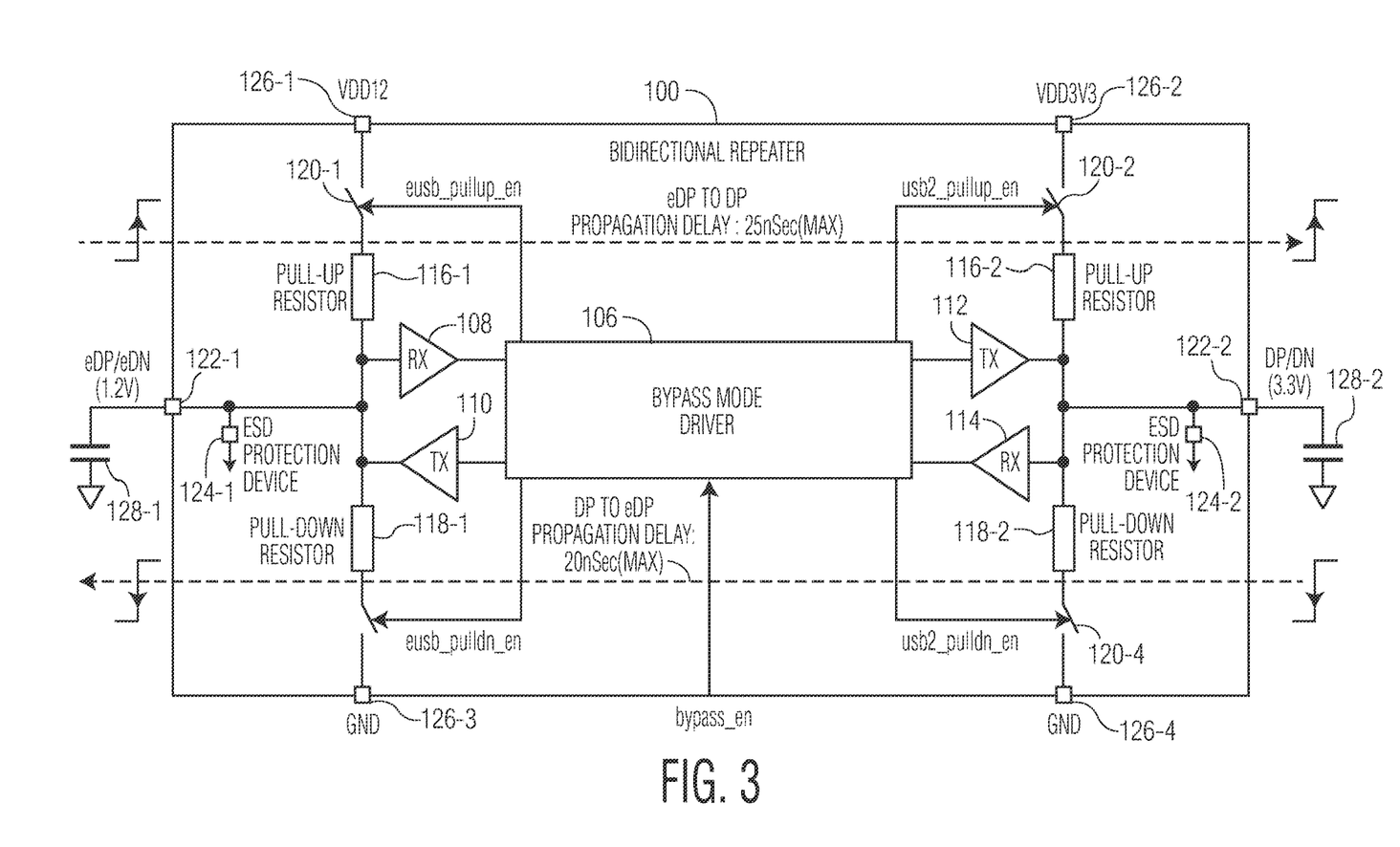
FIG. 3 depicts a control signal diagram under a bypass mode of the bidirectional repeater depicted in FIG. 1.

FIG. 3 depicts a control signal diagram under a bypass mode of the bidirectional repeater 100 depicted in FIG. 1. In the control signal diagram, the multiplexers 102-1, 102-2 shown in the FIG. 1 is not drawn to simplify the diagram. As depicted in FIG. 3, the bypass mode driver 106 is enabled by the bypass mode enablement signal, bypass_en, which is generated by the digital state machine 104 under the bypass mode. In response to the bypass mode enablement signal, bypass_en, the bypass mode driver 106 is configured to generate a control signal, eusb_pullup_en, to control the switch 120-1 connected to the pull-up resistor 116-1, a control signal, usb2_pullup_en, to control the switch 120-2 connected to the pull-up resistor 116-2, a control signal, eusb_pulldn_en, to control the switch 120-3 connected to the pull-down resistor 118-1, and a control signal, usb2_pulldn_en, to control the switch 120-4 connected to the pull-down resistor 118-2. In addition, in response to the bypass mode enablement signal, bypass_en, the bypass mode driver 106 is configured to generate control signals for the receivers 108, 114, and the transmitters, 110, 112.

An example operation of the bypass mode driver 106 is described as follows. A bypass mode is enabled by the digital state machine 104, for example, when a host configures the bidirectional repeater 100 in the bypass mode, for example, via I²C commands. Under the bypass mode, the bypass mode driver 106 controls the receivers 108, 114, the transmitters or drivers 110, 112, the pull-up resistors 116-1, 116-2, and the pull-down resistors 118-1, 118-2. Table-2 provides an example truth table of the bypass mode driver 106 that describes the behavior of the bypass mode driver's output as per autosensing of the signal level done by the receivers 108, 114. In the example truth table, logic values of the input and output of the bypass mode driver 106 are listed.

TABLE 2

| Input(Driven by a debugger/host) | Output(Driven by bypass mode driver) |
|---|---|
| Transition rising edge (0 → 1) | Follows the input signal (0 → 1) |
| Static High(1) | High(via weak pull-up) |
| Transition falling edge (1 → 0) | Follows the input signal (1 → 0) |
| Static Low(0) | Low(via weak pull-down) |
| Static High to Z (1 → HiZ) | No change(Remains High via weak pull-up) |
| Static Low to Z (1 → HiZ) | No change(Remains Low via weak pull-down) |

The bidirectional repeater 100 supports the bypass mode where high speed ports can be used to connect to a system debugger via a USB2 port. In the bypass mode, a debugger can run the UART, JTAG level signals over a USB2 port to communicate with a host processor using a debug bus. The bypass mode is implemented by re-use of existing USB2 differential driver and eUSB single-ended driver and single-ended receivers. The bypass mode driver 106 uses one-shot pulses to drive the bus state high/low and later holds the bus to certain logic states using week pull ups/downs. The bypass mode reuses existing pull-downs needed for eUSB and USB2 PHY functionality. When the bus is held low/high via week pull ups/downs, either a host or a debugger can drive the bus to communicate in either direction. The bypass mode driver 106 can support a max load of 10 pF on eUSB end and a max load of 50 pF on USB2 end. The bypass mode driver 106 can support push-pull GPIOs on the either end of the channel.

When the bypass mode is enabled, default state of the bypass mode driver 106 is weak low when the bus is not driven on either side. Any state changes of the differential eUSB signal (eDP/eDN) or the differential USB signal (DP/DN) at the I/O terminal 122-1 or 122-2 is sensed by existing single-ended receivers 108, 114. The output is driven by the transmitter 110, which may be a single ended FS mode driver on the eUSB side, or by the transmitter 112, which may be a differential FS driver on the USB2 side configured as two single-ended drivers. Two single-ended drivers can be driven independently under the bypass mode. Table-3 provides example bus states of the bypass mode driver 106.

TABLE 3

| State # | Line State | eUSB port | USB2 port |
|---|---|---|---|
| 1 | Transition rising edge (0 → 1) | Bypass mode driver driving high at 1.2 V level using existing eUSB driver for T(~22)ns | Bypass mode driver driving high at 3.3 V level using existing USB2 driver for T(~22)ns |
| 2 | Static High (1) | 10K ohm weak pull-up to hold the bus-state | 10K ohm weak pull-up to hold the bus-state |
| 3 | Transition falling edge (1 → 0) | Bypass mode driver driving low level using existing eUSB driver for T(~22)ns | Bypass mode driver driving low level using existing USB2 driver for T(~22)ns |
| 4 | Static Low (0) | 7K ohm weak pull-down to hold the bus-state | 15K ohm weak pull-down to hold the bus-state |

Figure 4:
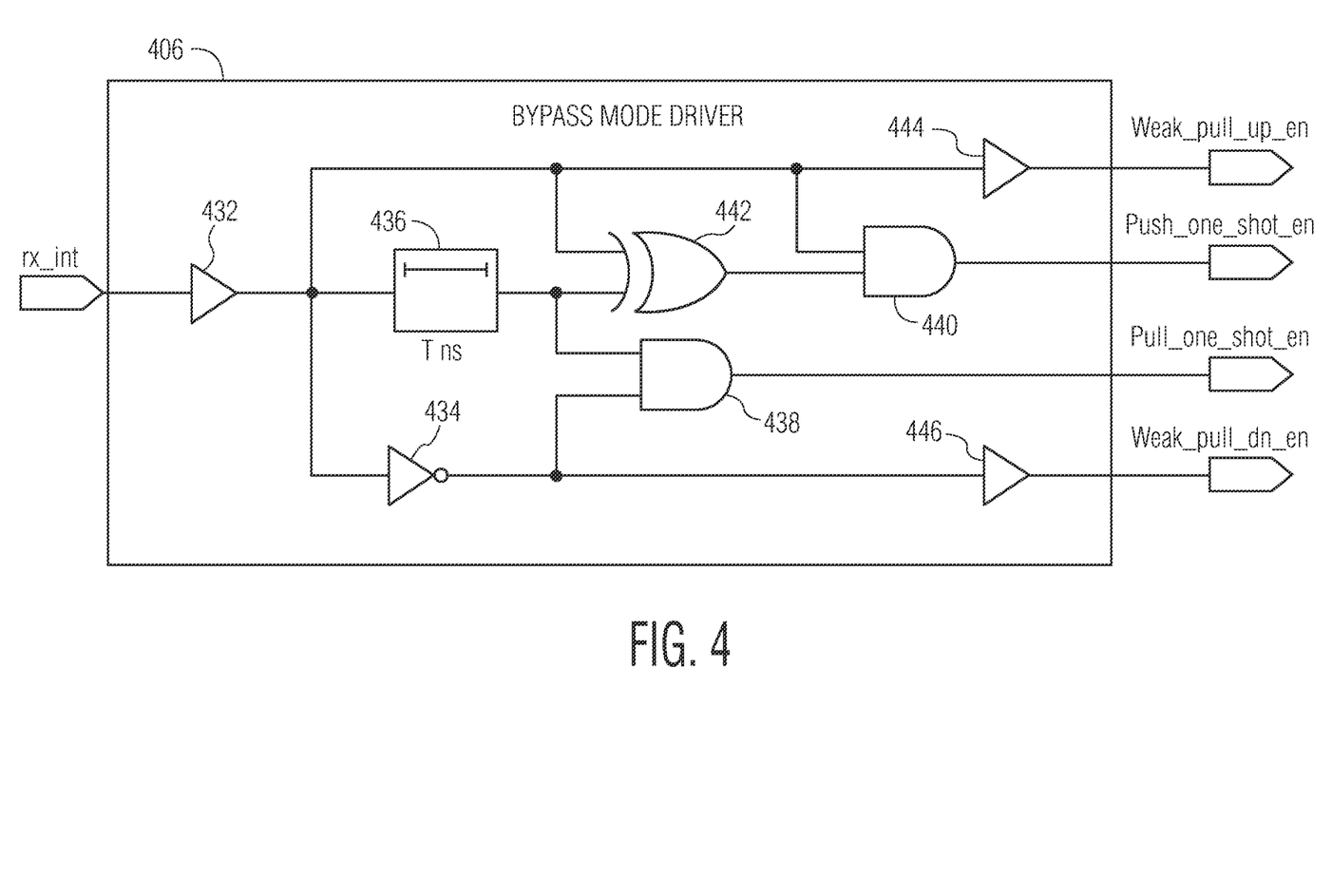
FIG. 4 depicts an embodiment of a bypass mode driver of the bidirectional repeater depicted in FIG. 1.

FIG. 4 depicts a bypass mode driver 406, which is an embodiment of the bypass mode driver 106 of the bidirectional repeater 100 depicted in FIG. 1. However, the bypass mode driver 106 depicted in FIG. 1 is not limited to the embodiment shown in FIG. 4 and can be implanted differently without less or more components and/or different topology between components. In the embodiment depicted in FIG. 4, the bypass mode driver 406 includes an input buffer 432, an inverter 434, a one-shot pulse generator 436, two AND gate 438, 440, an XOR gate 442, and two output buffers 444, 446. The bypass mode driver 406 receives an input signal, "rx_int," from a receiver (e.g., the receiver 108 or 114) and generates four control signals, "weak_pull_up_en," "push_one_shot_en," "pull_one_shot_en," and "weak_pull_dn_en," to control a pull-up resistor (e.g., the pull-up resistor 116-1 or 116-2), a transmitter (e.g., the transmitter 110 or 112), and a pull-down resistor (e.g., the pull-down resistor 118-1 or 118-2). Specifically, the control signal, weak_pull_up_en, is used to control a pull-up resistor (e.g., the pull-up resistor 116-1 or 116-2), the control signals, push_one_shot_en, pull_one_shot_en, are used to control a transmitter (e.g., the transmitter 110 or 112), and the control signal, weak_pull_dn_en, is used to control a pull-down resistor (e.g., the pull-down resistor 118-1 or 118-2). The output, rx_int, of a receiver (e.g., the receiver 108 or 114) is sensed by the input buffer 432 of the bypass mode driver 406. At every rising edge of the incoming signal, rx_int, a one-shot pulse of duration "T" is generated by the one-shot pulse generator 436 as the signals, push_one_shot_en, and, weak_pull_up_en, go high tracking the input signal to hold the bus high after one-shot pulse drives the logic high on the bus. Similarly, at every falling edge of the incoming signal, rx_int, a one-shot pulse of duration "T" is generated as the signals, pull_one_shot_en, and, weak_pull_dn_en, go high tracking the input signal (inverse of input logic) to hold the bus low after one-shot pulse drive the logic low on the bus. In some embodiments, the one-shot pulse duration of the one-shot pulse generator 436 is programmable to support various cable lengths. For example, one-shot pulse duration (T) of about 22 nanoseconds (ns) can be used to support the one-meter cable system requirement during a debug mode. A one-shot pulse duration that is higher than 22 ns can be programmed to support a cable that is longer than one meter. In some embodiments, a bypass mode of the bidirectional repeater 100 is used to support a one-meter cable on a USB2 port. Existing drivers can support longer cable length and higher load conditions as per system needs by increasing the one-shot pulse duration. One-shot pulse duration may be greater than two times the transmission delay of the cable and PCB channel delay added together to have clean signals. One-shot pulse duration can allow the signal to travel from output driver to far-end open ended termination via a source-terminated cable and reflect back to an output driver to reach full signal levels before the high-impedance bus-keeper resistor is enabled. A higher one-shot duration can also lead to higher turn-around time for half duplex signaling.

Figure 5:
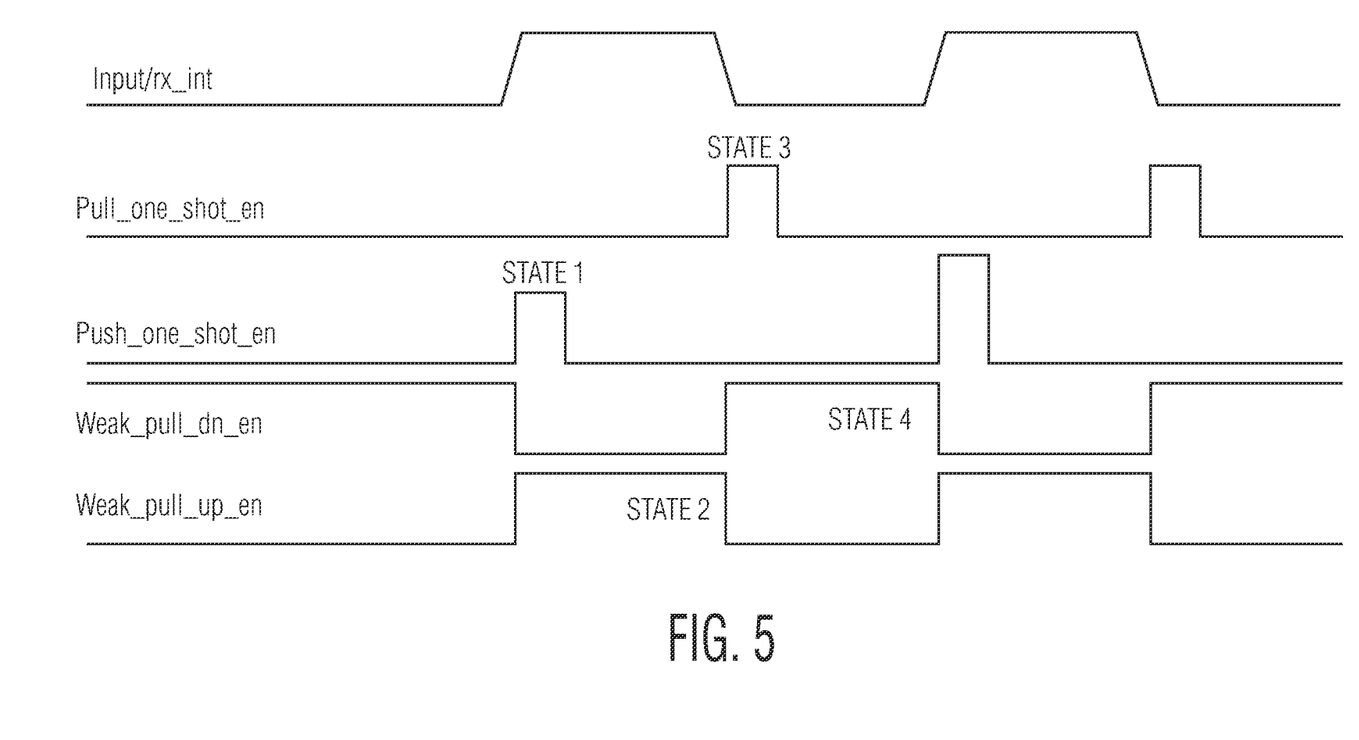
FIG. 5 depicts some examples of waveforms of an input signal to the bypass mode driver depicted in FIG. 4, and control signals that are generated by the bypass mode driver depicted in FIG. 4.

FIG. 5 depicts some examples of waveforms of the input signal, rx_int, to the bypass mode driver 406 depicted in FIG. 4, and the four control signals, weak_pull_up_en, push_one_shot_en, pull_one_shot_en, and weak_pull_dn_en, which are generated by the bypass mode driver 406 depicted in FIG. 4. Although the input signal is shown in a single ended form, in real applications, the input signal may be a differential signal. In the example waveforms depicted in FIG. 5, these control signals are used by existing drivers by multiplexing these control signals with existing eUSB/USB2 functional signals. When a bypass mode is selected or enabled by the bypass mode enablement signal, bypass_en, signals are driven from eUSB to USB2 pins and vice versa based on auto-direction sensing. As per auto-direction sensing, the bypass mode driver 406 of the respective path is enabled for one-shot pulse duration to transmit the signal from RX to TX of the respective channel and later bus-keepers are enabled to hold the new bus state.

When a transition of "0→1" of the input signal, rx_int, is sensed by the input buffer 432, the control signal, push_one_shot_en, goes high (state 1) for a pulse duration of T nano-second of the one-shot pulse generator 436 to pull the output high at VDD level and the control signal, weak_pull_up_en, goes high (state 2) to close (i.e., being conductive) a switch connected to a pull-up resistor (e.g., the switch 120-1 connected to the pull-up resistor 116-1 or the switch 120-2 connected to the pull-up resistor 116-2). After one-shot pulse is removed, the output is held high using the weak pull-up resistor, and the transmitter is tri-stated (e.g., disabled). Logic state "1" is maintained by the pull-up resistor connected to VDD.

When a transition of ""1→0" of the input signal, rx_int, is sensed is sensed by the input buffer 432, the control signal, pull_one_shot_en, goes high (state 3) for a duration of T nano-second of the one-shot pulse generator 436 to pull the output low at GND level and the control signal, weak_pull_dn_en, goes high (state 4) to close (i.e., being conductive) a switch connected to a pull-down resistor (e.g., the switch 120-3 connected to the pull-down resistor 118-1 or the switch 120-4 connected to the pull-down resistor 118-2). After one-shot pulse is removed, the output is held low using the weak pull-down resistor and the transmitter is tri-stated (e.g., disabled). Logic state "0" is maintained by the pull-down resistor connected to GND.

Figure 6:
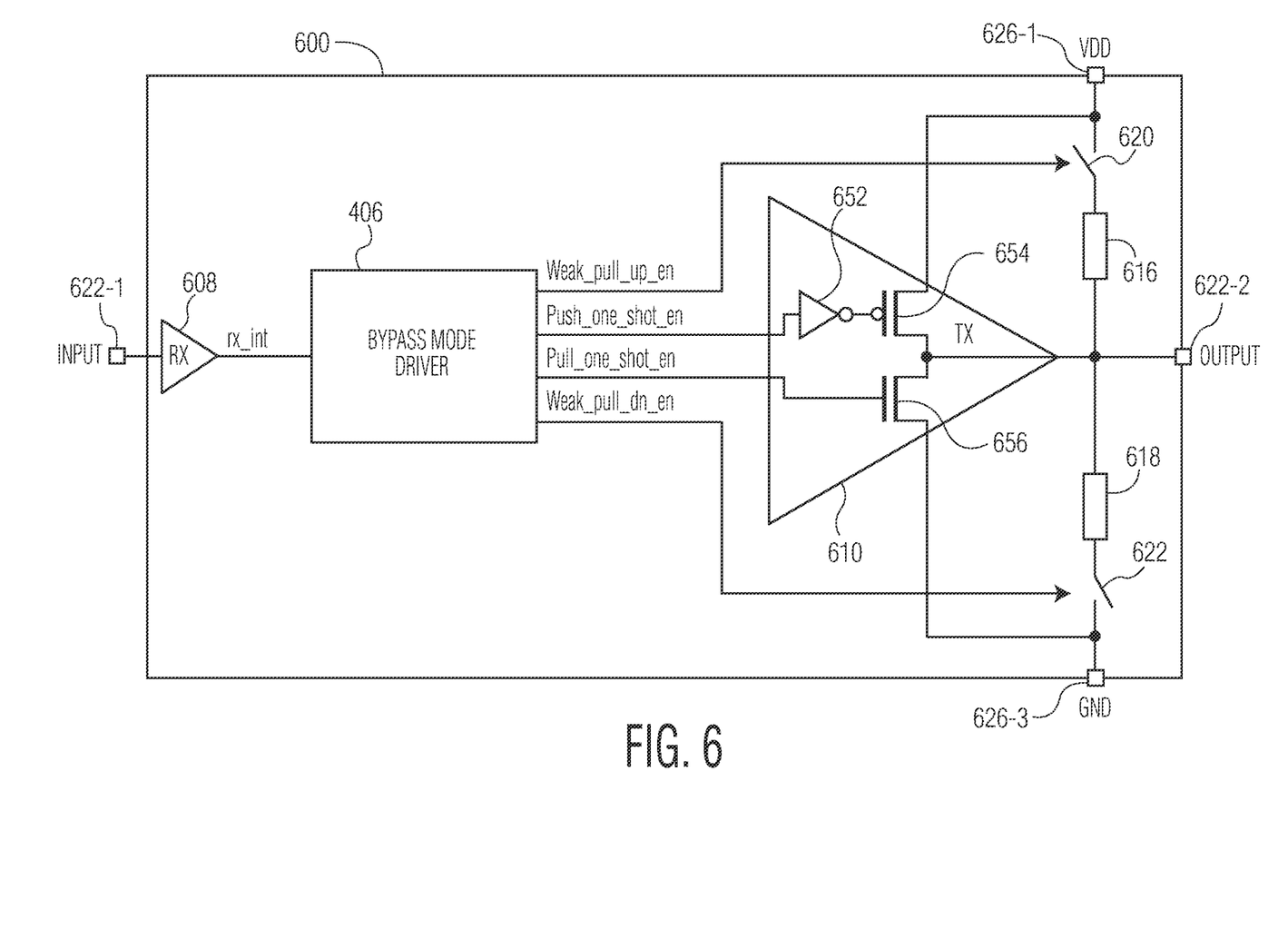
FIG. 6 depicts one path of a bidirectional repeater in which a bypass mode driver depicted in FIG. 4 uses control signals to control a pull-up resistor, a transmitter, and a pull-down resistor.

FIG. 6 depicts one path of a bidirectional repeater 600 in which the bypass mode driver 406 depicted in FIG. 4 uses the four control signals, weak_pull_up_en, push_one_shot_en, pull_one_shot_en, and weak_pull_dn_en, to control a pull-up resistor 616, a transmitter 610, and a pull-down resistor 618. In the embodiment depicted in FIG. 6, the bidirectional repeater 600 includes a receiver 608, the bypass mode driver 406, the pull-up resistor 616, the transmitter 610, and the pull-down resistor 618. In the embodiment depicted in FIG. 6, the transmitter 610 includes an inverter 652, a PMOS transistor 654, and an NMOS transistor 656. The bidirectional repeater 600 may also include an additional receiver, an additional transmitter, an additional pull-up resistor, and an additional pull-down resistor. The bidirectional repeater 600 is an embodiment of the bidirectional repeater 100 depicted in FIG. 1. However, the bidirectional repeater 100 depicted in FIG. 1 is not limited to the embodiment shown in FIG. 6. The receiver 608 is an embodiment of the receiver 108 or 114 depicted in FIG. 1. The pull-up resistor 616 is an embodiment of the pull-up resistor 116-1 or 116-2 depicted in FIG. 1. The transmitter 610 is an embodiment of the transmitter 110 or 112 depicted in FIG. 1. The pull-down resistor 618 is an embodiment of the pull-down resistor 118-1 or 118-2 depicted in FIG. 1. However, the receiver 108 or 114, the pull-up resistor 116-1 or 116-2, the transmitter 110 or 112, and the pull-down resistor 118-1 or 118 depicted in FIG. 1 are not limited to the embodiments shown in FIG. 6. An example operation of the bidirectional repeater 600 is described as follows. When a transition of "0→1" of an input signal, rx_int, from the receiver 608 is sensed by the bypass mode driver 406, the control signal, push_one_shot_en, goes high to pull the output high at VDD level and the control signal, weak_pull_up_en, goes high to close (i.e., being conductive) the switch 620 connected to the pull-up resistor 616 (e.g., the switch 120-1 connected to the pull-up resistor 116-1 or the switch 120-2 connected to the pull-up resistor 116-2). Subsequently, the output is held high using the weak pull-up resistor 616, and the transmitter is tri-stated as both the PMOS and NMOS transistors 654, 656 are disabled. When a transition of "1→0" of the input signal, rx_int, from the receiver 608 is sensed by the bypass mode driver 406, the control signal, pull_one_shot_en, goes high to pull the output low at GND level and the control signal, weak_pull_dn_en, goes high to close (i.e., being conductive) the switch 622 connected to the pull-down resistor 618 (e.g., the switch 120-3 connected to the pull-down resistor 118-1 or the switch 120-4 connected to the pull-down resistor 118-2). Subsequently, the output is held low using the weak pull-down resistor 618 and the transmitter is tri-stated as both the PMOS and NMOS transistors 654, 656 are disabled.

Figure 7:
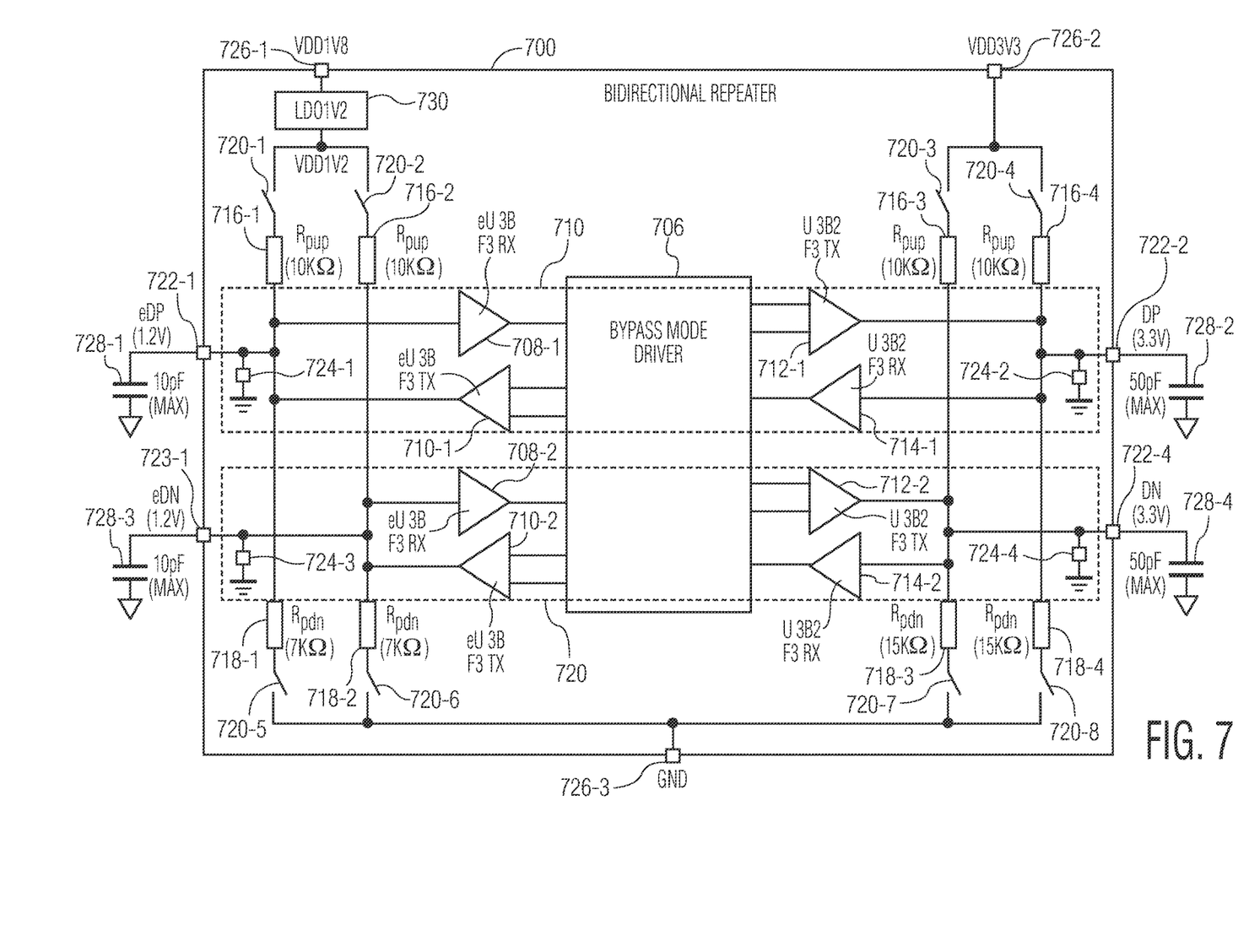
FIG. 7 depicts a bidirectional repeater that has multiple signal paths.

FIG. 7 depicts a bidirectional repeater 700 that has multiple signal paths, which is an embodiment of the bidirectional repeater 100 depicted in FIG. 1. However, the bidirectional repeater 100 depicted in FIG. 1 is not limited to the embodiment shown in FIG. 7 and can be implanted differently without less or more components and/or different topology between components. In the embodiment depicted in FIG. 7, the bidirectional repeater 700 includes a bypass mode driver 706, a receiver (RX) 708-1 (e.g., an eUSB full speed (FS) receiver), a receiver 708-2 (e.g., an eUSB FS receiver), a receiver 714-1 (e.g., a USB2 FS receiver), a receiver 714-2 (e.g., a USB2 FS receiver), a transmitter (TX) 710-1 (e.g., an eUSB full speed (FS) transmitter), a transmitter 710-2 (e.g., an eUSB FS transmitter), a transmitter 712-1 (e.g., a USB2 FS transmitter), a transmitter 712-2 (e.g., a USB2 FS transmitter), pull-up resistors 716-1, 716-2, 716-3, 716-4 with resistance values such as 10 KΩ, pull-down resistors 718-1, 718-2, 718-3, 718-4 with resistance values such as 7 KΩ and 15 KΩ, switches 720-1, 720-2, 720-3, 720-4, 720-5, 720-6, 720-7, 720-8, I/O terminals or ports 722-1, 722-2, 722-3, 722-4, ESD protection circuits 724-4, 724-2, and a low-dropout regulator (LDO) 730. 2 single ended channels are supported by chip in bypass mode. In the embodiment depicted in FIG. 7, signal paths or channels 770-1, 770-2 can work independently from each other. For example, two single ended paths from left to right and two single ended paths from right to left can work at the same time. In some embodiments, two single-ended channels are used as one differential channel as per system needs. Four possible combinations for signal path in the bidirectional repeater 700 include eDP→DP & eDN→DN, eDP→DP & DN→eDN, DP→eDP & eDN→DN, and DP→eDP & DN→eDN. The port signal path and direction can change on the fly for half duplex configuration. In some embodiments, the pull-down resistors are included as part of the eUSB/USB2 repeater requirement, while the pull-up resistors are added to support a bypass mode. Although the bidirectional repeater 700 is shown in FIG. 7 as including certain circuit elements, in other embodiments, bidirectional repeater 700 may include one or more additional circuit elements. For example, the bidirectional repeater 700 may include one or more multiplexers, which may be the same as or similar to the multiplexers 102-1, 102-2 depicted in FIG. 1, and one or more digital state machines, which may be the same or similar to the digital state machine 104 depicted in FIG. 1. In some embodiments, capacitors 728-1, 728-2, 728-3, 728-4, for example, decoupling capacitors, are connected to the I/O terminals 722-1, 722-2, 722-3, 722-4, respectively, and a reference voltage (e.g., the ground).

Figure 8:
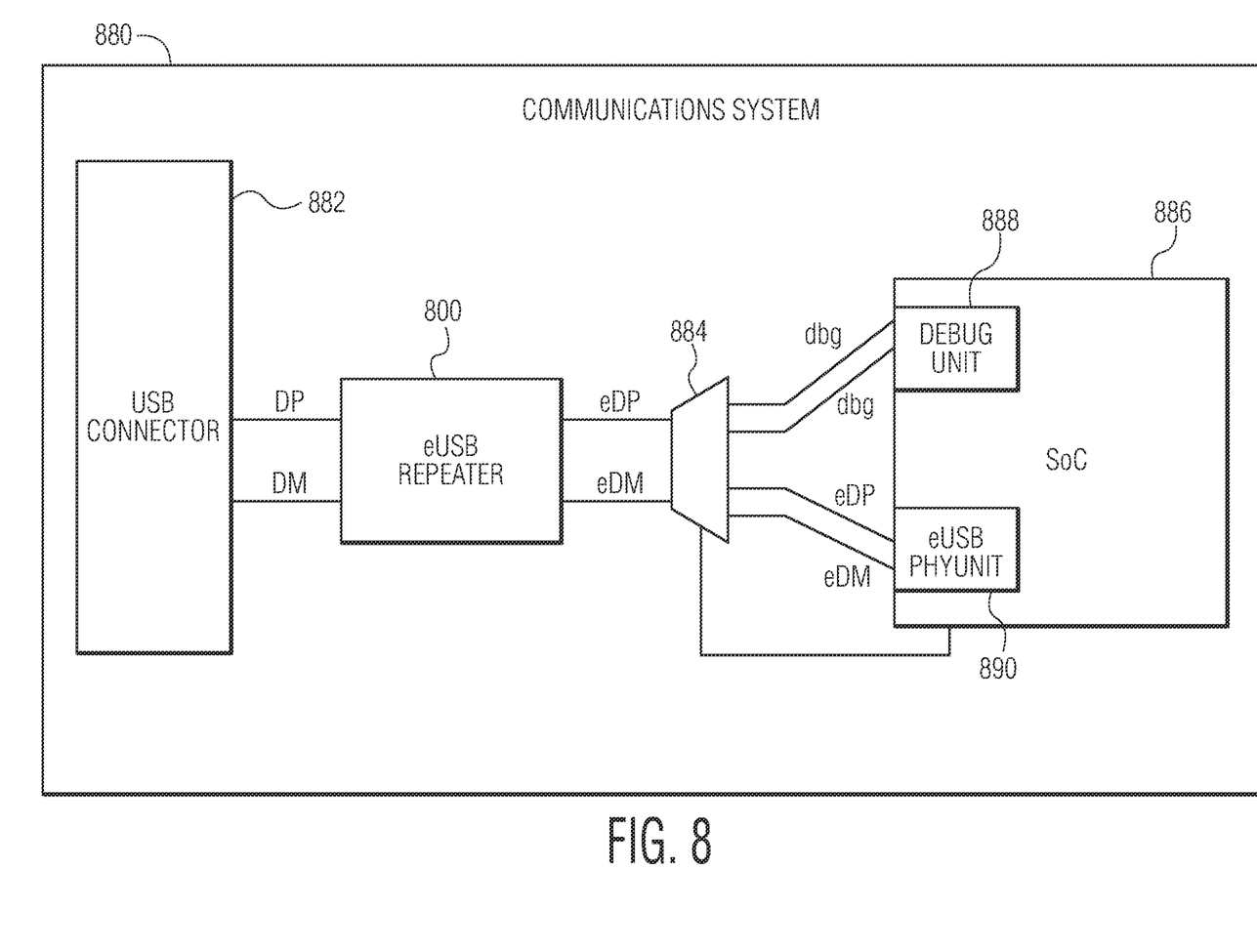
FIG. 8 is a schematic block diagram of a communications system in accordance with an embodiment of the invention.

FIG. 8 is a schematic block diagram of a communications system 880 in accordance with an embodiment of the invention. In the embodiment depicted in FIG. 8, the communications system 880 includes a USB controller 882, an eUSB bidirectional repeater 800, a multiplexer 884, and a system-on-chip (SoC) 886, which includes a debug unit 888 configured to perform a debug function and an eUSB physical layer (PHY) unit 890, which may be configured to perform a physical layer function. The debug unit may be implemented as hardware, software, firmware, and/or a combination of hardware, software, and/or firmware. In some embodiments, the debug unit is implemented as a processor such as a microcontroller or a CPU. The eUSB bidirectional repeater 800 may be the same as or similar to the bidirectional repeater 100 depicted in FIG. 1, the bidirectional repeater 600 depicted in FIG. 6, and the bidirectional repeater 700 depicted in FIG. 7. Although the communications system 880 is shown in FIG. 8 as including certain circuit elements, in other embodiments, the communications system 880 may include one or more additional circuit elements.

Although some examples are described with reference to USB, the invention is not limited to USB and can be used for any type of signal conditioner that supports protocol based multi standard chips. The invention can be integrated in a low-frequency and high-frequency squelch detector. For example, the invention can also be used for Thunderbolt (TBT) and/or DisplayPort (DP) applications.

In the above description, specific details of various embodiments are provided. However, some embodiments may be practiced with less than all of these specific details. In other instances, certain methods, procedures, components, structures, and/or functions are described in no more detail than to enable the various embodiments of the invention, for the sake of brevity and clarity.

Although the operations of the method(s) herein are shown and described in a particular order, the order of the operations of each method may be altered so that certain operations may be performed in an inverse order or so that certain operations may be performed, at least in part, concurrently with other operations. In another embodiment, instructions or sub-operations of distinct operations may be implemented in an intermittent and/or alternating manner.

It should also be noted that at least some of the operations for the methods described herein may be implemented using software instructions stored on a computer useable storage medium for execution by a computer. As an example, an embodiment of a computer program product includes a computer useable storage medium to store a computer readable program. The computer-useable or computer-readable storage medium can be an electronic, magnetic, optical, electromagnetic, infrared, or semiconductor system (or apparatus or device). Examples of non-transitory computer-useable and computer-readable storage media include a semiconductor or solid-state memory, magnetic tape, a removable computer diskette, a random-access memory (RAM), a read-only memory (ROM), a rigid magnetic disk, and an optical disk. Current examples of optical disks include a compact disk with read only memory (CD-ROM), a compact disk with read/write (CD-R/W), and a digital video disk (DVD).

Alternatively, embodiments of the invention may be implemented entirely in hardware or in an implementation containing both hardware and software elements. In embodiments which use software, the software may include but is not limited to firmware, resident software, microcode, etc.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A bidirectional repeater, the bidirectional repeater comprising:
   a digital state machine configured to control the bidirectional repeater to operate under a functional mode or under a bypass mode; and
   a bypass mode driver that, under the bypass mode, is configured to:
     automatically detect a signal direction of a signal through a plurality of input/output (I/O) terminals of the bidirectional repeater; and
     enable a bypass data path through the bidirectional repeater based on the signal direction, such that the signal bypasses a functional data path of the bidirectional repeater that is arranged in parallel with the bypass data path, wherein the bidirectional repeater, under the functional mode, is configured to:
enable the functional data path through the bidirectional repeater.

2. The bidirectional repeater of claim 1, wherein the bypass mode driver is further configured to allow the signal to pass through the bidirectional repeater without alteration of a plurality of logic values carried by the signal under the bypass mode.

3. The bidirectional repeater of claim 2, wherein the digital state machine is configured to control the bidirectional repeater to operate under the functional mode to translate a plurality of signals between the I/O terminals of the bidirectional repeater.

4. The bidirectional repeater of claim 3, wherein the bypass mode driver is further configured to dynamically perform voltage level shifting of the signal under the bypass mode.

5. The bidirectional repeater of claim 1, further comprising a plurality of multiplexers connected to the digital state machine and the bypass mode driver.

6. The bidirectional repeater of claim 1, further comprising:
a plurality of transmitters connected to the I/O terminals of the bidirectional repeater; and
a plurality of receivers connected to the I/O terminals of the bidirectional repeater, wherein the bypass mode driver is configured to allow the signal to transfer from one of the receivers to a corresponding transmitter of the transmitters based on the signal direction.

7. The bidirectional repeater of claim 6, further comprising:
a plurality of pull-up resistors connected to the receivers and the I/O terminals of the bidirectional repeater;
a plurality of pull-down resistors connected to the transmitters and the I/O terminals of the bidirectional repeater; and
a plurality of switches connected to the pull-up resistors or the pull-down resistors.

8. The bidirectional repeater of claim 7, wherein the bypass mode driver is further configured to control the switches under the bypass mode.

9. The bidirectional repeater of claim 7, wherein the bypass mode driver is further configured to control the switches and at least one of the transmitters under the bypass mode.

10. The bidirectional repeater of claim 9, wherein the bypass mode driver is further configured to disable a P-channel metal-oxide semiconductor field-effect transistor (MOSFET) (PMOS) transistor and an N-channel MOSFET (NMOS) transistor of at least one of the transmitters under the bypass mode.

11. The bidirectional repeater of claim 1, wherein the digital state machine is further configured to generate a bypass mode enablement signal to enable the bidirectional repeater under the bypass mode.

12. The bidirectional repeater of claim 1, wherein the bidirectional repeater is an embedded Universal Serial Bus (USB) (eUSB)/USB bidirectional repeater.

13. The bidirectional repeater of claim 11, wherein the bidirectional repeater comprises an eUSB port and a USB port.

14. The bidirectional repeater of claim 13, wherein the bidirectional repeater and an eUSB device connected to the eUSB port are located on the same substrate.

15. The bidirectional repeater of claim 1, wherein the bypass mode driver comprises at least one pulse generator and a plurality of buffers.

16. A bidirectional repeater, the bidirectional repeater comprising:
a digital state machine configured to control the bidirectional repeater to operate under a functional mode or under a bypass mode;
a plurality of transmitters connected to a plurality of input/output (I/O) terminals of the bidirectional repeater;
a plurality of receivers connected to the I/O terminals of the bidirectional repeater;
a bypass mode driver configured to, under the bypass mode:
automatically detect a signal direction of a signal through the I/O terminals of the bidirectional repeater; and
enable a bypass path between one of the receivers and a corresponding transmitter of the transmitters based on the signal direction of the signal, such that the signal bypasses a functional data path of the bidirectional repeater that is arranged in parallel with the bypass data path, wherein the bidirectional repeater is configured to enable the functional data path under the functional mode; and
a plurality of multiplexers connected to the digital state machine and the bypass mode driver.

17. The bidirectional repeater of claim 16, further comprising:
a plurality of pull-up resistors connected to the receivers and the I/O terminals of the bidirectional repeater;
a plurality of pull-down resistors connected to the transmitters and the I/O terminals of the bidirectional repeater; and
a plurality of switches connected to the pull-up resistors or the pull-down resistors.

18. The bidirectional repeater of claim 17, wherein the bypass mode driver is further configured to control the switches and at least one of the transmitters under the bypass mode.

19. The bidirectional repeater of claim 16, wherein the bidirectional repeater is an embedded Universal Serial Bus (USB) (eUSB)/USB bidirectional repeater.

* * * * *